United States Patent [19]

Carley

[11] 3,980,507
[45] Sept. 14, 1976

[54] METHOD OF MAKING A SEMICONDUCTOR DEVICE

[75] Inventor: Donald Raymond Carley, Somerville, N.J.

[73] Assignee: RCA Corporation, New York, N.Y.

[22] Filed: Apr. 24, 1975

[21] Appl. No.: 571,106

[30] Foreign Application Priority Data
Apr. 25, 1974 United Kingdom............ 18165/74

[52] U.S. Cl.............................. 148/187; 156/17
[51] Int. Cl.²................................. H01L 21/225
[58] Field of Search................. 148/187; 156/17

[56] References Cited
UNITED STATES PATENTS

| | | | |
|---|---|---|---|
| 3,160,539 | 12/1964 | Hall et al. | 156/17 |
| 3,675,319 | 7/1972 | Smith | 148/187 UX |
| 3,738,880 | 6/1973 | Laker | 148/187 X |
| 3,830,665 | 8/1974 | Roman et al. | 156/17 X |
| 3,846,198 | 11/1974 | Wen et al. | 156/17 |
| 3,847,687 | 11/1974 | Davidsohn | 148/187 |

OTHER PUBLICATIONS

Greenwood, "Ethylene Diamine–Catechol–Water Mixture —etc.," J. Electrochem. Soc., vol. 116, No. 9, Sept. 1969, pp. 1325, 1326.

*Primary Examiner*—L. Dewayne Rutledge
*Assistant Examiner*—J. M. Davis
*Attorney, Agent, or Firm*—H. Christoffersen; R. P. Williams

[57] ABSTRACT

Portions of a polycrystalline silicon layer disposed on an insulator are removed after diffusing donor impurities into and through the regions to be removed. The regions to be retained are either previously or simultaneously doped with acceptor impurities. The method provides improved control of the size and the shape of the edges of the retained regions.

8 Claims, 12 Drawing Figures

METHOD OF MAKING A SEMICONDUCTOR DEVICE

This invention relates to a method of etching silicon in a controlled manner and pertains in particular to a method of making a patterned polycrystalline silicon layer in a semiconductor device.

Certain solvents for silicon are selective for N-type or intrinsic silicon, i.e. they etch N-type or intrinsic silicon at a rate much faster than the rate at which they attack P-type silicon. Aqueous hydrazine and a solution of potassium hydroxide and propanol are examples of such solvents.

Deposited layers of polycrystalline silicon have been used in integrated circuit devices as the material of conductors and resistors. These deposited layers ordinarily overlie insulating material, which may be either silicon dioxide formed as a coating on a body of silicon, or may be sapphire in the so-called silicon-on-sapphire technology. One example of the use of polycrystalline silicon as a conductor is in self-aligned gate MOS devices, in which a polycrystalline silicon layer of defined shape serves as a gate electrode.

One known method of defining the shape of a polycrystalline silicon layer is disclosed in U.S. Pat. No. 3,738,880 to Laker. In this method, portions of a layer of polycrystalline silicon are doped by diffusion to a relatively high degree of P-type conductivity with boron. The entire layer is then contacted with one of the selective solvents to remove the undoped material. This method is satisfactory for its intended purpose but does result in defined layers which are larger than their designed size and in which the edges tend to overhang, that is, the layer tends to be wider at the top than at the bottom. This is the result of the masked diffusion process which is employed to render the retained material P type. Side diffusion will enlarge the P type region relative to the size of the mask opening. The shape of the diffusion front will produce the overhanging edges. Improved control of the size of the retained material and of the edge shape is desirable. In the drawings:

The present method employs the known selective solvents for silicon and may be characterized as including a step of introducing donor impurities into surface adjacent portions of a body of silicon which are desired to be removed, so as to impart N-type conductivity thereto, whereas other surface adjacent portions of the body which are to be retained are given P-type conductivity, either separately or simultaneously. Of importance is the fact that the material to be retained is defined geometrically by the introduction of donor impurities in the areas adjacent to it, so that the enlargement and edge shaping results of side diffusion which have taken place in the prior processes are avoided.

Figure 1:
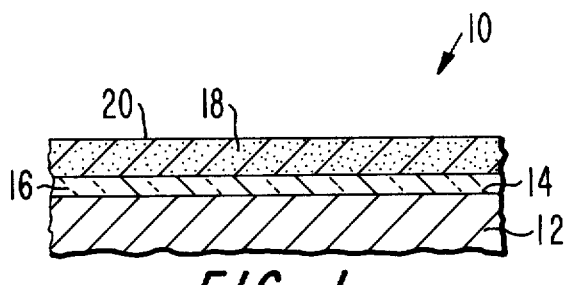
FIG. 1 is a partial cross-section through a semiconductor device having a polycrystalline silicon layer, at an early stage in one embodiment of the present novel process.

In one example the present novel process may begin with a device 10 (FIG. 1) comprising a layer of substantially intrinsic polycrystalline silicon disposed on an insulator. The device 10 may include a body of monocrystalline silicon 12 with an upper surface 14 on which is disposed a layer 16 of insulating material. The layer 16 may be for example, thermally grown silicon dioxide. On the layer 16 which constitutes an insulating substrate, is a layer 18 of, in this example, substantially intrinsic polycrystalline silicon. The layer 18 may be formed, for example, by the thermal decomposition of silane ($SiH_4$) diluted with hydrogen in the manner known in the preparation of silicon gate MOS devices. The thickness of the layer 18 may be approximately 8000A.

Figure 2A:
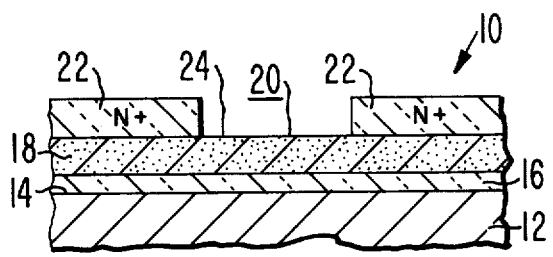
FIGS. 2A and 2B are cross-sections representing the next steps in two alternative embodiments of the process.

The device 10 is next treated to introduce donor impurities into those portions thereof which are to be removed and to introduce acceptor impurities into the portions which are to be retained. One way to accomplish this is to form on the surface 20 of the layer 18 a deposited coating of doped silicon dioxide and then to define this layer photolithographically into a pattern representative of the material to be removed. The cross-section of the device 10 treated in this way is shown in FIG. 2A. In FIG. 2A, there are shown two blocks 22 of doped silicon dioxide. One way to form the blocks 22 is to dispose the device 10 in a suitable furnace and expose the surface 20 to the vapors of silane ($SiH_4$) and oxygen at an elevated temperature. Such a process is known as chemical vapor deposition. A small amount of phosphine ($PH_3$) may be included in the silane atmosphere in order to provide phosphorus as the donor impurities in the blocks 22. Chemical vapor deposition techniques are known and are discussed in detail for example in U.S. Pat. No. 3,481,781, issued to Kern on Dec. 2, 1969 and in which the coating is referred to as a glass coating. After the formation of the doped oxide coating, it may be defined into the blocks 22 by conventional photolithographic processes. The result of these processes is to leave a portion 24 of the surface 20 of the layer 18 exposed.

Figure 3A:
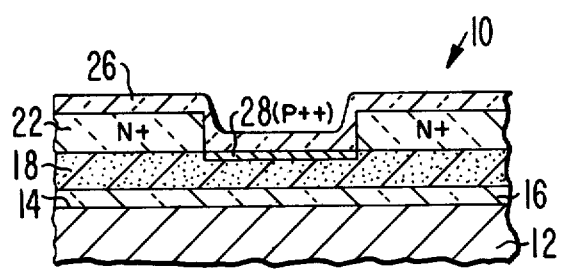
FIGS. 3A and 3B are cross-sections representing steps following those illustrated in FIGS. 2A and 2B respectively.

Next, the portion 24 of the surface 20 which is not covered by blocks 22 is provided with a source of acceptor impurities. This may be accomplished for example by exposing the device 10 to a source of boron, in an oxidizing atmosphere, in a conventional diffusion furnace for a time sufficient to form on the surface of the entire device 10 a borosilicate glass coating, illustrated in FIG. 3A at 26. The deposition of the borosilicate glass coating 26 when carried out in conventional fashion at elevated temperature will also result in the production in the layer 18 of a region 28 of highly doped P++ type conductivity. The area of the zone 28 will be controlled by the masking effect of the block 22.

In effect, two impurity sources are provided on the surface 20 of the layer 18, one consisting of the blocks 22 as a source of donor impurities and the other consisting of the layer 26 of borosilicate glass.

Figure 2B:
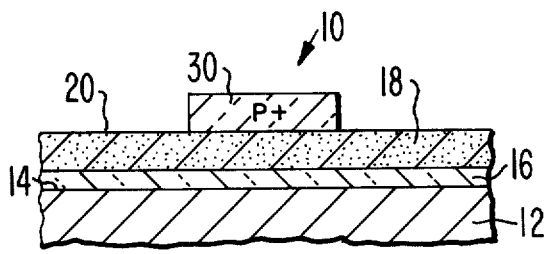
Figure 3B:
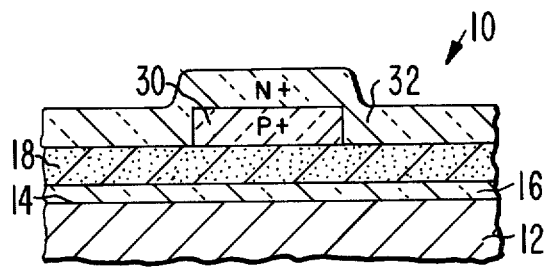

An alternative method of providing the two sources, of donor and acceptor impurities respectively, is illustrated in FIGS. 2B and 3B. In this example, a source of acceptor impurities is first formed on the surface 20 of the layer 18 and may take the form of a deposited block 30 of P+ doped silicon dioxide. The block 30 may be formed in a manner similar to the formation of blocks 22 in FIG. 2A but with the substitution of diborane ($B_2H_6$) for the phosphine in the deposition reaction so as to render the block 30 P type. The block 30 may be formed by depositing a continuous layer of doped oxide and then defining it photolithographically. The definition of the block 30 will leave the boron doped oxide over the areas of the coating 18 which are to be retained.

Next, a source of donor impurities is formed on the device 10 and this may be done in any desired manner. In the example illustrated in FIG. 3B, a layer 32 of phosphorus doped silicon dioxide is deposited over the device 10. This may be accomplished by chemical vapor deposition in a manner similar to that described above for the formation of the blocks 22 in FIG. 2A. Alternatively, the layer 32 may be formed of phosphosilicate glass by exposing the surface 20 to the vapors of phosphorus oxychloride.

Figure 4:
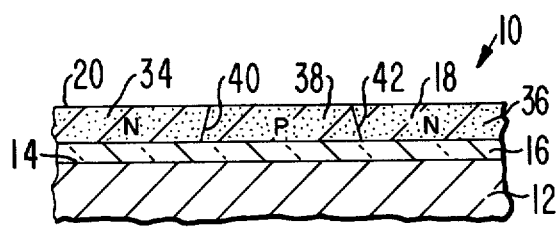
FIG. 4 is a cross-section illustrating the structure of the device after either of the previous alternative process stages.

Once the two sources, of donor and acceptor impurities respectively, are formed on the surface 20 of the layer 18, a heat treatment step is carried out to diffuse the impurities into the material of the layer 18 to define N-type and P-type regions therein. The result of such a heat treatment is shown in FIG. 4, which is a cross-sectional view of the device 10 after the diffusion step from either the sources of FIG. 3A or the sources of FIG. 3B, and after the removal of the sources. The layer 18, formed in this way, has two zones 34 and 36 of N type conductivity and a central zone 38 of P-type conductivity. Between the zone 38 and the zones 34 and 36 respectively, are defined PN junction boundaries 40 and 42. The boundaries 40 and 42 will be relatively steeply inclined with respect to the surface 20 of the layer 18 in this example of the process. The reason for this is the simultaneous diffusion of the acceptor and donor impurites. In other words, donor impurities will diffuse into the layer 18 from the respective sources thereof and will diffuse toward the center as well. Similarly, acceptor impurities will diffuse from the corresponding source and will diffuse outwardly, i.e. laterally toward the regions 34 and 36. These simultaneous diffusions will compensate each other and the result will be a relatively steep boundary. The locations of the boundaries will coincide very well with the edges of the photolithographically-defined source.

The next step is to contact the entire surface of the layer 18 with a solvent in which N-type silicon is soluble but in which P-type silicon is substantially insoluble, for a time sufficient to remove the material of the zones 34 and 36 and to leave the material of the zone 38 in the desired pattern. Suitable solvents are the same ones as disclosed in the Laker patent identified above, namely aqueous hydrazine or potassium hydroxide-propanol. Either of these solvents is selective for relatively highly doped P type silicon. By relatively highly doped is meant here a doping of a minimum of about $10^{16}$ atom/cm$^3$. The diffusion processes used to form the zone 38 should therefore be carried out under conditions appropriate for achieving a doping level of this value or greater.

Figure 5:
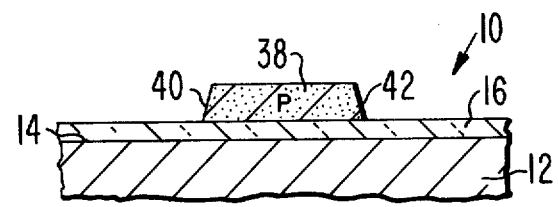
FIG. 5 is a cross-section of the device subsequent to a selective etching step.

The result of the etching step is the finished device 10 as shown in FIG. 5. The zone 38 will remain with relatively steep edge boundaries 40 and 42. The width of the zone 38 will correspond quite closely to the dimensions of the original photolithographically defined boundaries owing to the confinement of the lateral diffusion of the acceptors in the regions 38 by the compensating diffusion of donors in the opposite direction. The shape is relatively steep, also owing to this controlling action.

Figure 6:
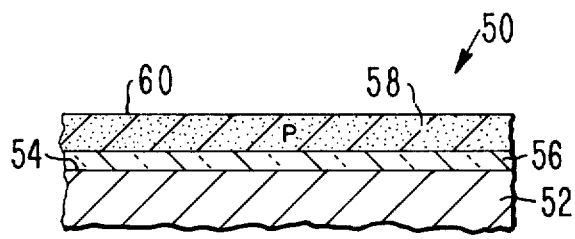
FIG. 6 is a cross-section through a semiconductor device similar to that of FIG. 1, in the early stages of other alternative embodiments of the present novel method.

In the above explained example, a simultaneous diffusion of both donor and acceptor impurities is carried out. In an alternative embodiment of the present method, the polycrystalline silicon layer may be doped P-type throughout its volume in the initial phase of the process. A semiconductor device 50 having this structure is shown in FIG. 6. The device 50 includes a body 52 of semiconductive material which has a surface 54 on which is disposed an insulating coating 56. These elements correspond to the body 12, the surface 14, and the coating 16 of the device 10.

A polycrystalline silicon layer 58 is disposed on the insulating coating 56. This coating is of P-type conductivity throughout its volume and may be formed by the deposition of the material from silane ($SiH_4$) in a manner similar to the formation of the layer 18 but with the addition to the deposition atmosphere of a suitable doping impurity such as boron, in the form of diborane for example. Alternatively, the layer 58 may be deposited as intrinsic material and thereafter doped by diffusion or any other process to render it P type. Like the layer 18 the layer 58 may be about 8000A thick. It has a surface 60 spaced from and substantially parallel to the surface 54 of the body 52.

Figure 7A:
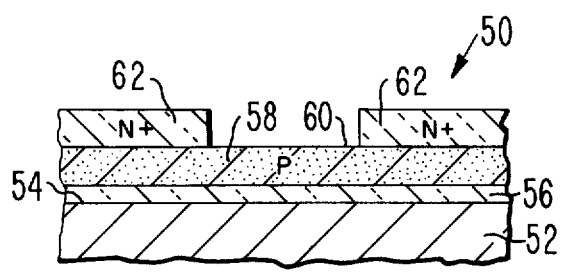
FIGS. 7A and 7B are cross-sections representing alternative steps of treating the device of FIG. 6.

The next step in this embodiment is to form on the surface 60 of the layer 58 a source of donor impurities defined in the pattern of the areas of the layer 58 which are to be removed. One way to accomplish this is illustrated in FIG. 7A. Here, doped oxide diffusion sources in the form of blocks 62 are formed on the surface 60 of the layer 58. The blocks 62 may be formed in the same manner as has been described above for the formation of the blocks 22.

Figure 7B:
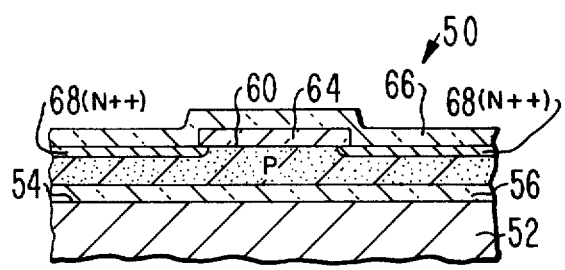

As an alternative method of forming a donor diffusion source, the process represented by the cross-section of FIG. 7B may be used. Here a diffusion masking structure, which may be for example a coating of deposited silicon dioxide 64, is formed on the surface 60 of the layer 58. The coating 64 is then define photolithographically to leave portions thereof, e.g. the portion shown, over the areas of the layer 58 which are to be retained. Next, a source of donor impurities, such as a coating of phosphosilicate glass 66 is deposited over the entire surface of the device 50 in a conventional deposition operation. This deposition step also results in the formation of highly doped N++ regions 68 in the layer 58.

Figure 8:
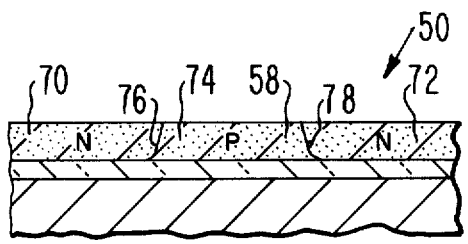
FIG. 8 is a cross-section illustrating the configuration of the device after the performance of the steps represented in FIGS. 7A and 7B.
Figure 9:
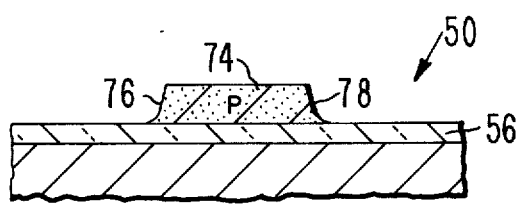
FIG. 9 is a cross-section illustrating the result of subjecting the device of FIG. 8 to a selective etching step.

Next, the device 50 is heated to diffuse donor impurities from the source on the surface 60 into the layer 58. The result of the diffusion step is shown in FIG. 8 in which a diffusion of donor impurities throughout the thickness of the coating 58 is illustrated. Zones 70 and 72 of N type conductivity are thus produced adjacent to and bounding a zone 74 of P type conductivity. Boundaries 76 and 78 are thereby defined between the zone 74 and the adjacent one of the zones 70 and 72 respectively. The shape of the boundaries 76 and 78 will be convex toward the zone 74 owing to the shape of the diffusion front resulting from the N type diffusion. Note that a simultaneous P type diffusion does not take place in this example. The next step in this example is to contact the entire surface of the film 58 with one of the selective etchants for a time sufficient to remove all of the material of the zones 70 and 72. This step will leave the device 50 in the configuration shown in FIG. 9 in which the zone 74 remains on the insulating coating 56. The boundaries 76 and 78 will remain as edges of the zone 74 and will have a relatively gentle slope corresponding to the shape of the diffusion front of the zones 70 and 72. This edge shape is preferable for many applications, such as those in which an insulator (not shown) is subsequently formed over the zone 74 and a crossing conductor (also not shown) is deposited over the insulator. A deposited layer is more likely to be continuous over an edge of this shape than over the overhanging edge produced in the known method. It should be pointed out that while relatively smooth curves are shown for the diffusion fronts here, the material of the layer is polycrystalline and there may be some irregularities in actual practice.

In all of the processes described above the material which has been treated has been a polycrystalline silicon layer on an insulating substrate. It is preferred to apply the present method to this material since it lends itself well to the defintion of conductor patterns in integrated circuit fabrication. The method may be used to define patterns of recessed areas in monocrystalline silicon but there are difficulties in applying the method to monocrystalline material. The etchants which are selective for P-type silicon are also anisotropic in monocrystalline silicon. By this is meant that they dissolve silicon at different rates depending on the direction within the material. For example, each of the aqueous hydrazine and potassium hydroxide-propanol solvents will etch silicon in the 100 direction at a rate much faster than in the 111 direction. This phenomenon is known in the art and is used for example to form relatively sharply defined V shaped grooves in silicon. The result of attempting to use the anisotropic solvents to remove N doped material and to leave P doped material in monocrystalline silicon often results in uncontrolled etch pits and other undesirable features. Consequently the method, although not limited thereto, is best applied to the definition of relatively thin layers of polycrystalline silicon as has been described here.

What is claimed is:

1. A method of etching a layer of silicon disposed on a substrate, said layer having a surface, to remove a first surface-adjacent portion of said layer having a defined boundary in said surface while retaining a second surface-adjacent portion adjacent to said defined boundary, said second portion being of P type conductivity, comprising introducing donor impurities only into said first portion of said layer by diffusing said donor impurities from a source on said surface to impart N type conductivity thereto, and contacting the entire surface of said layer with a solvent in which N type silicon is soluble but in which P type silicon is substantially insoluble for a time sufficient to remove said first portion of said layer.

2. A method as defined in claim 1 wherein said solvent is selected from the group consisting of aqueous hydrazine and potassium hydroxide-propanol.

3. A method as defined in claim 1 wherein said step of introducing donor impurities comprises diffusing said donor impurities throughout the entire thickness of said layer.

4. A method as defined in claim 3 wherein said layer is initially of substantially intrinsic conductivity and wherein said method further comprises introducing acceptor impurities into said second portion of said layer simultaneously with said step of introducing donor impurities into said first portion of said layer, by diffusing said acceptor impurities from a source on said surface.

5. A method as defined in claim 3 wherein said layer is initially of P-type conductivity throughout its volume, said donor impurities being introduced into said body in sufficient quantity to invert said first portion of said body to N type conductivity.

6. A method as defined in claim 1 further comprising forming said source on said layer by depositing a layer of silicon dioxide containing a conductivity modifier onto said surface, photolithographically removing portions of said layer of silicon dioxide to leave remaining portions thereof over said first portion of said layer, and heating said layer to carry out said introducing step.

7. A method as defined in claim 6 further comprising forming a diffusion resistant mask over said second portion of said layer, forming said source on said layer thereafter, and heating said layer to carry out said introducing step.

8. A method as defined in claim 7 wherein said diffusion resistant mask comprises a layer of silicon dioxide containing an acceptor impurity, whereby, during said donor impurity introducing step, acceptor impurities are introduced into said second portion of said layer.

* * * * *